United States Patent [19]

Sugimoto

[11] Patent Number: 5,998,314
[45] Date of Patent: Dec. 7, 1999

[54] LOW-TEMPERATURE SINTERABLE CERAMIC COMPOSITION, AND MONOLITHIC CERAMIC SUBSTRATE USING THE SAME

[75] Inventor: Yasutaka Sugimoto, Kyoto, Japan

[73] Assignee: Murata Manufacturing Co., Ltd., Japan

[21] Appl. No.: 09/033,802

[22] Filed: Mar. 3, 1998

[30] Foreign Application Priority Data

Mar. 4, 1997 [JP] Japan ..................................... 9-049198
Jan. 7, 1998 [JP] Japan ................................... 10-001551

[51] Int. Cl.⁶ ............................. C03C 8/20; C03C 14/00; C03C 10/08
[52] U.S. Cl. ................................ 501/32; 501/18; 501/17; 501/21; 501/65; 501/66; 501/77; 501/9; 428/426; 428/428; 428/689; 428/427
[58] Field of Search .................................. 501/17, 18, 21, 501/32, 65, 66, 77, 9; 428/426, 428, 427, 689

[56] References Cited

U.S. PATENT DOCUMENTS

| | | | |
|---|---|---|---|
| 4,595,662 | 6/1986 | Mochida et al. | 501/32 |
| 4,665,039 | 5/1987 | Kokubu et al. | 501/66 |
| 5,024,975 | 6/1991 | Hartmann | 501/32 |
| 5,070,046 | 12/1991 | Hu | 501/77 |
| 5,145,540 | 9/1992 | Foley et al. | 501/32 |
| 5,206,190 | 4/1993 | Jean et al. | 501/32 |
| 5,242,867 | 9/1993 | Lin et al. | 501/32 |
| 5,283,210 | 2/1994 | Kata et al. | 501/32 |
| 5,532,194 | 7/1996 | Kawashima et al. | |
| 5,556,585 | 9/1996 | Yano et al. | 501/32 |

FOREIGN PATENT DOCUMENTS

| | | |
|---|---|---|
| 0219807A2 | 10/1986 | European Pat. Off. . |
| 0480468A1 | 10/1991 | European Pat. Off. . |

*Primary Examiner*—Michael Marcheschi
*Attorney, Agent, or Firm*—Ostrolenk, Faber, Gerb & Soffen, LLP

[57] ABSTRACT

Disclosed are a low-temperature sinterable ceramic composition comprising 100 parts by weight of an essential component composed of from about 60 to 85% by weight of cordierite and from about 15 to 40% by weight of glass, and not larger than about 25 parts by weight of $TiO_2$, and a monolithic ceramic substrate comprising the composition. The composition can be sintered at relatively low temperatures, and the sintered substrate has a small thermal expansion coefficient and a small dielectric constant. The temperature-dependent variation in the electrostatic capacity of the substrate is small. Preferably, the glass component in the composition is composed of about 20 to 60% by weight of $SiO_2$, about 30 to 50% by weight of $B_2O_3$, about 5 to 30% by weight of MgO, 0 to about 15% by weight of $Al_2O_3$, and about 1 to 5% by weight of $R_2O$ in which R is an alkali metal.

20 Claims, 1 Drawing Sheet

LOW-TEMPERATURE SINTERABLE CERAMIC COMPOSITION, AND MONOLITHIC CERAMIC SUBSTRATE USING THE SAME

FIELD OF THE INVENTION

The present invention relates to a ceramic composition, particularly to a low-temperature sinterable ceramic composition, and a monolithic ceramic substrate using the ceramic composition.

BACKGROUND OF THE INVENTION

With the popularization of small-sized electronic appliances, ceramic substrates have extensively been used for mounting various electronic parts thereon to construct such electronic appliances. Recently, monolithic ceramic substrates have been developed in order to further increase the packaging density of electronic parts mounted thereon. Monolithic ceramic substrates are generally prepared by laminating a plurality of ceramic green sheets each having on its surface a circuit pattern made from an electroconductive paste, followed by baking. Alumina has heretofore usually been used as the ceramic material for those monolithic ceramic substrates.

However, monolithic ceramic substrates of alumina are problematic in the following points.

1. Since alumina has a high sintering temperature falling between 1500 and 1600° C., laminated alumina green sheets require substantial energy for baking, resulting in an increase in the production costs of the monolithic ceramic substrate.

2. The electroconductive material for inner circuits to be formed inside the monolithic ceramic substrates of alumina is limited to a high-melting-point metal that is resistant to high-temperature baking, such as W or Mo. However, since these metals have a high specific resistivity, the circuit pattern made of the metal has a high resistance value.

3. Since the thermal expansion coefficient of alumina is larger than that of silicon chips constituting semiconductor parts to be mounted on the alumina substrates, thermal stress is imparted to the silicon chips and may cause them to crack.

4. Since alumina has a high dielectric constant of about 10, the time delay for the signal transmission through circuits inside the monolithic alumina substrates is large.

Recently, there is an increasing demand for monolithic substrates for LCR-integrated LSI capable of being driven at a high frequency of over 10 MHz. Those monolithic substrates require not only the solution of the problems noted above but also to have a small temperature-dependent variation in the dielectric capacity of the substrate material of, for example, not higher than ±30 ppm/° C.

SUMMARY OF THE INVENTION

Given the above situation, the object of the present invention is to provide a low-temperature sinterable ceramic composition, which can be sintered at relatively low temperatures, which has a small thermal expansion coefficient and a small dielectric constant, and whose temperature-dependent variation in electrostatic capacity is small, and to provide a monolithic ceramic substrate comprising the composition.

To attain the object, the invention provides a low-temperature sinterable ceramic composition comprising 100 parts by weight of an essential component composed of from about 60 to 85% by weight (preferably about 65 to 80%) of cordierite and from about 15 to 40% by weight (preferably about 20 to 35%) of glass, and not more than about 25 parts by weight (preferably about 15 to 25 parts) of a $TiO_2$ side component.

Preferably, the glass component in the composition is composed of from about 20 to 60% by weight of $SiO_2$, from about 30 to 50% by weight of $B_2O_3$, from about 5 to 30% by weight of MgO, from 0 to about 15% by weight of $Al_2O_3$ and from about 1 to 5% by weight of $R_2O$ in which R is an alkali metal.

In the composition, the side component $TiO_2$ has a negative temperature coefficient of electrostatic capacity. Having been added to the essential component composed of cordierite and glass and baked, this $TiO_2$ acts to lower the absolute value of the temperature coefficient of the resulting sintered composition.

The invention also provides a monolithic ceramic substrate comprising the low-temperature sinterable ceramic composition as a dielectric or insulating material.

PREFERRED MODES OF CARRYING OUT THE INVENTION

Figure 1:
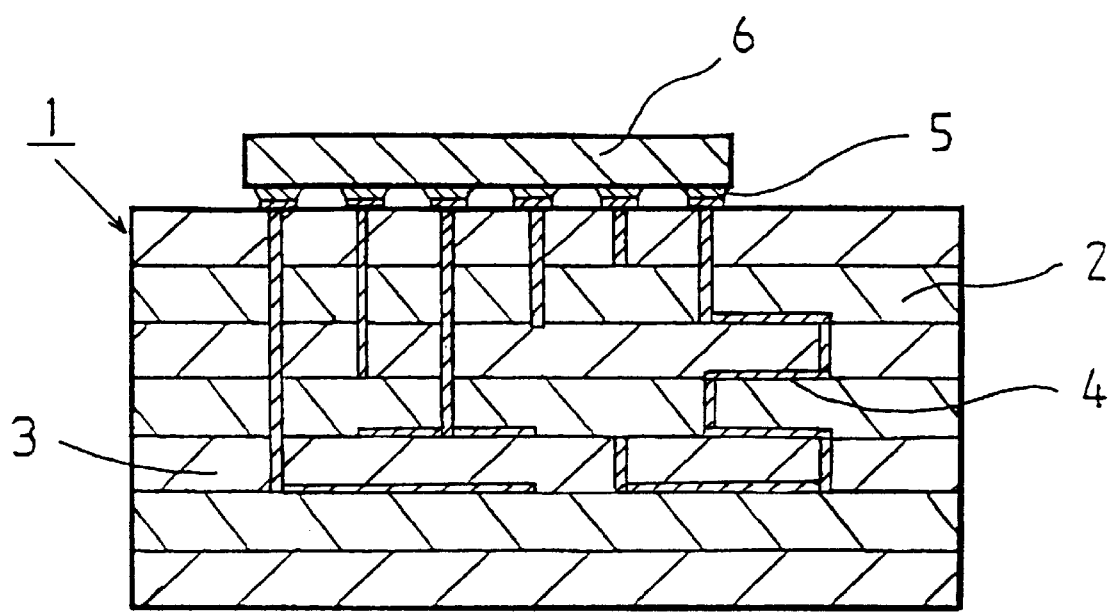
FIG. 1 is a cross-sectional view illustrating one embodiment of the monolithic ceramic substrate of the invention.

Now, preferred modes of carrying out the invention relating to the low-temperature sinterable ceramic composition and the monolithic ceramic substrate are mentioned below with reference to the following Examples.

EXAMPLE 1

Raw materials of cordierite, $SiO_2$, MgO and $Al_2O_3$ were weighed and mixed. This mixture was calcined at 1350 to 1400° C., and ground to obtain a cordierite powder having a composition of $Mg_2Al_4Si_5O_{18}$ and having a mean grain size of from 1 to 3 µm.

Next prepared were powdery raw materials of the glass, namely $SiO_2$, $B_2O_3$, $MgCO_3$, $Al_2O_3$ and $Li_2CO_3$.

These were weighed and mixed to give glass of $SiO_2:B_2O_3:MgO:Al_2O_3:Li_2O=27:40:22:8:3$ (by weight), melted at 1450 to 1550° C. for 1 to 4 hours, and thereafter rapidly cooled and vitrified. The resulting glass pieces were milled in a zirconia ball mill to obtain glass powder having a mean grain size of from 0.5 to 3 µm.

Next, the glass powder and the cordierite powder produced above were mixed with $TiO_2$ powder that had been prepared previously in varying ratios as shown in Table 1 below, and then wet-milled in a zirconia ball mill or the like for 3 to 4 hours to obtain homogeneous powdery mixtures comprising glass powder and ceramic powder. In Table 1, the amount of $TiO_2$ is in terms of parts by weight relative to 100 parts by weight of the total amount of cordierite and glass. Next, an organic binder and a solvent of toluene were added to and mixed with each powdery mixture, and then kneaded in a ball mill to obtain homogeneous dispersions. These were thereafter defoamed under reduced pressure to give slurries. The organic vehicles such as binder, solvent and plasticizer used herein are conventional and their components are not specifically defined.

TABLE 1

| Sample No. | Ratio of Cordierite to Glass (wt. %) | | TiO₂ (wt. pts.) |
|---|---|---|---|
| | Cordierite | Glass | |
| *1 | 90 | 10 | 0 |
| *2 | 90 | 10 | 15 |
| *3 | 90 | 10 | 25 |
| *4 | 90 | 10 | 33 |
| *5 | 85 | 15 | 0 |
| 6 | 85 | 15 | 15 |
| 7 | 85 | 15 | 25 |
| *8 | 85 | 15 | 33 |
| *9 | 80 | 20 | 0 |
| 10 | 80 | 20 | 15 |
| 11 | 80 | 20 | 25 |
| *12 | 80 | 20 | 33 |
| *13 | 60 | 40 | 0 |
| 14 | 60 | 40 | 15 |
| 15 | 60 | 40 | 25 |
| *16 | 60 | 40 | 33 |
| *17 | 55 | 45 | 0 |
| *18 | 55 | 45 | 15 |
| *19 | 55 | 45 | 25 |
| *20 | 55 | 45 | 33 |

Each slurry was cast onto a film support using a doctor blade to form strips of ceramic green sheets having a thickness of 0.2 mm. After having been dried, these strips were peeled off the film support and blanked to give ceramic green sheets having a predetermined size.

Next, a plurality of the thus-prepared ceramic green sheets were laminated and pressed to form a monolithic ceramic body, which was then heated at a heating rate of 200° C./hr, and baked at 980° C. for 2 hours to obtain a sintered ceramic body.

The thermal expansion coefficient, the dielectric constant and the temperature coefficient of dielectric constant of each of those sintered ceramic bodies produced herein were measured. The data obtained are shown in Table 2 below along with the sintered condition of each body. In Table 1 and Table 2, the samples marked with an asterisk (*) are outside the scope of the invention.

TABLE 2

| Sample No. | Thermal Expansion Coefficient (ppm/° C.) | Dielectric Constant (1 MHZ) | Temperature Coefficient (ppm/° C.) | Sintered Condition |
|---|---|---|---|---|
| *1 | — | — | — | Not sintered |
| *2 | — | — | — | Not sintered |
| *3 | — | — | — | Not sintered |
| *4 | — | — | — | Not sintered |
| *5 | 3.0 | 5.1 | 240 | Good |
| 6 | 3.5 | 6.3 | 30 | Good |
| 7 | 3.9 | 6.9 | 5 | Good |
| *8 | 4.4 | 7.4 | −20 | Good |
| *9 | 3.1 | 5.1 | 220 | Good |
| 10 | 3.6 | 6.2 | 20 | Good |
| 11 | 4.0 | 7.0 | 0 | Good |
| *12 | 4.5 | 7.4 | −30 | Good |
| *13 | 3.5 | 4.9 | 180 | Good |
| 14 | 4.0 | 6.0 | 15 | Good |
| 15 | 4.3 | 6.7 | −5 | Good |
| *16 | 4.9 | 7.3 | −40 | Good |
| *17 | — | — | — | Fused |
| *18 | — | — | — | Fused |
| *19 | — | — | — | Fused |
| *20 | — | — | — | Fused |

As is obvious from Table 2, the samples of ceramic composition of the invention comprising 100 parts by weight of the essential component composed of from about 60 to 85% by weight of cordierite and from about 15 to 40% by weight of glass and not more than about 25 parts by weight of the side component TiO₂ were well sintered when baked at the relatively low temperature of 980° C. As compared with alumina, those samples have a small dielectric constant falling between 6.0 and 7.0, a small thermal expansion coefficient falling between 3.5 and 4.3 ppm/° C., and a small temperature coefficient of dielectric constant falling between −5 and +30 ppm/° C.

As opposed to these, the reference samples Nos. 1 to 4 having a glass content of smaller than about 15% by weight could not be sintered well at the temperature lower than 1000° C., while the reference samples Nos. 17 to 20 having a glass content of larger than about 40% by weight were fused while being baked. This is because the baking temperature 980° C. was too high for the latter samples Nos. 17 to 20. In addition, those samples Nos. 17 to 20 have poor mechanical strength because they contain too much glass. For these reasons, the glass content of the composition of the invention preferably falls between about 15 and 40% by weight.

On the other hand, the reference samples Nos. 8, 12 and 16, in which the TiO₂ content is larger than about 25 parts by weight, are unfavorable for monolithic substrates since their absolute value of the temperature coefficient of dielectric constant is large and since their thermal expansion coefficient and dielectric constant are large.

EXAMPLE 2

Cordierite powder was prepared in the same manner as in Example 1. The powdery glass compositions in Table 3 below were prepared also in the same manner as in Example 1.

Next, the glass powder and the cordierite powder prepared herein were mixed with TiO₂ powder that had been prepared previously in the varying ratios shown in Table 3, and then wet-milled in a zirconia ball mill or the like for 3 to 4 hours to obtain homogeneous powdery mixtures comprising glass powder and ceramic powder. In this, the ratio of glass to cordierite was 20/80 by weight, and the amount of TiO₂ added was 15 parts by weight relative to 100 parts by weight of the total of glass and cordierite. Next, an organic binder and a solvent of toluene were added to and mixed with each powdery mixture, and then kneaded in a ball mill to obtain homogeneous dispersions. These were thereafter defoamed under reduced pressure to give slurries.

Using these slurries, green sheets were formed, laminated, pressed, and baked at 980° C. for 2 hours in the same manner as in Example 1 to produce sintered ceramic bodies.

TABLE 3

| Sample No. | Glass (wt. %) | Glass Composition (wt. %) | | | | | Cordierite (wt. %) | TiO₂ (wt. pts.) |
|---|---|---|---|---|---|---|---|---|
| | | SiO₂ | B₂O₃ | MgO | Al₂O₃ | Li₂O | | |
| *21 | 20 | 15 | 48 | 26 | 8 | 3 | 80 | 15 |
| 22 | 20 | 27 | 40 | 22 | 8 | 3 | 80 | 15 |
| *23 | 20 | 65 | 16 | 8 | 8 | 3 | 80 | 15 |
| *24 | 20 | 18 | 55 | 16 | 8 | 3 | 80 | 15 |
| *25 | 20 | 39 | 50 | 0 | 8 | 3 | 80 | 15 |
| *26 | 20 | 22 | 32 | 35 | 8 | 3 | 80 | 15 |
| 27 | 20 | 41 | 35 | 13 | 8 | 3 | 80 | 15 |
| *28 | 20 | 24 | 34 | 19 | 20 | 3 | 80 | 15 |
| *29 | 20 | 28 | 41 | 23 | 8 | 0 | 80 | 15 |

TABLE 3-continued

| Sample No. | Glass (wt. %) | Glass Composition (wt. %) | | | | | Cordierite (wt. %) | $TiO_2$ (wt. pts.) |
|---|---|---|---|---|---|---|---|---|
| | | $SiO_2$ | $B_2O_3$ | MgO | $Al_2O_3$ | $Li_2O$ | | |
| *30 | 20 | 26 | 39 | 21 | 8 | 6 | 80 | 15 |
| 31 | 20 | 20 | 49 | 20 | 8 | 3 | 80 | 15 |
| 32 | 20 | 60 | 31 | 6 | 1 | 2 | 80 | 15 |
| 33 | 20 | 55 | 30 | 6 | 6 | 3 | 80 | 15 |
| 34 | 20 | 24 | 50 | 15 | 8 | 3 | 80 | 15 |
| 35 | 20 | 38 | 46 | 5 | 8 | 3 | 80 | 15 |
| 36 | 20 | 26 | 33 | 30 | 8 | 3 | 80 | 15 |
| 37 | 20 | 33 | 40 | 24 | 0 | 3 | 80 | 15 |
| 38 | 20 | 28 | 34 | 20 | 15 | 3 | 80 | 15 |
| 39 | 20 | 28 | 40 | 23 | 8 | 1 | 80 | 15 |
| 40 | 20 | 27 | 39 | 21 | 8 | 5 | 80 | 15 |

The thermal expansion coefficient, the dielectric constant, the temperature coefficient of dielectic constant, and the dielectric loss of each of those sintered ceramic bodies produced herein were measured. The data obtained are shown in Table 4 below along with the sintered condition of each body. In Table 3 and Table 4, the samples marked with an asterisk (*) are outside the scope of the invention.

TABLE 4

| Sample No. | Thermal Expansion Coefficient (ppm/° C.) | Dielectric Constant (1 MHZ) | Temperature Coefficient (ppm/° C.) | Dielectric Loss (%) | Sintered Condition |
|---|---|---|---|---|---|
| *21 | — | — | — | — | Foamed |
| 22 | 3.6 | 6.2 | +20 | 0.1 | Good |
| *23 | — | — | — | — | Not sintered |
| *24 | — | — | — | — | Foamed |
| *25 | — | — | — | — | Not sintered |
| *26 | — | — | — | — | Foamed |
| 27 | 3.3 | 6.0 | +15 | 0.1 | Good |
| *28 | — | — | — | — | Not sintered |
| *29 | — | — | — | — | Not sintered |
| *30 | — | — | — | — | Foamed |
| 31 | 4.0 | 6.3 | +25 | 0.1 | Good |
| 32 | 3.4 | 5.9 | +10 | 0.1 | Good |
| 33 | 3.5 | 5.9 | +10 | 0.1 | Good |
| 34 | 4.0 | 6.2 | +20 | 0.1 | Good |
| 35 | 3.4 | 6.1 | +20 | 0.1 | Good |
| 36 | 3.5 | 6.2 | +20 | 0.1 | Good |
| 37 | 3.1 | 6.2 | +20 | 0.1 | Good |
| 38 | 4.2 | 6.3 | +25 | 0.1 | Good |
| 39 | 3.5 | 6.1 | +20 | 0.1 | Good |
| 40 | 3.7 | 6.3 | +25 | 0.1 | Good |

As seen in Table 4, the glass component is preferably composed of $SiO_2$, $B_2O_3$, MgO, $Al_2O_3$ and $Li_2O$, and the proportions of these constituents are preferably limited as follows:

If the amount of $SiO_2$ is smaller than about 20% by weight as in the reference samples Nos. 21 and 24, the viscosity of the glass composition is so low that the composition is foamed between the ceramic grains existing therein. On the other hand, if the amount of $SiO_2$ is larger than about 60% by weight as in the reference sample No. 23, the viscosity of the glass composition is so high that the sinterability of the ceramic composition is poor. Therefore, the $SiO_2$ content is preferably from about 20 to 60% by weight.

If the amount of $B_2O_3$ is smaller than about 30% by weight as in the reference sample No. 23, the viscosity of the glass composition is so high that the sinterability of the ceramic composition is poor. On the other hand, if the amount of $B_2O_3$ is larger than about 50% by weight as in the reference sample No. 24, the chemical stability of the glass composition is so poor that the composition is foamed. Therefore, the $B_2O_3$ content is preferably from about 30 to 50% by weight.

If the amount of MgO is smaller than about 5% by weight as in the reference sample No. 25, the viscosity of the glass composition is so high that the ceramic composition is not sintered. On the other hand, if the amount of MgO is larger than about 30% by weight as in the reference sample No. 26, excess MgO unfavorably reacts with the cordierite and the composition is foamed. Therefore, the MgO content is preferably from about 5 to 30% by weight.

$Al_2O_3$ is added to improve the chemical stability of the glass composition. If, however, its amount is larger than about 15% by weight as in the reference sample No. 28, the viscosity of the glass composition is so high that the ceramic composition is not sintered. Therefore, the $Al_2O_3$ content is preferably not larger than about 15% by weight.

If the amount of $Li_2O$ is smaller than about 1% by weight as in the reference sample No. 29, the composition is not sintered. On the other hand, if its amount is larger than about 5% by weight as in the reference sample No. 30, the composition is foamed. Therefore, the $R_2O$ content is preferably from about 1 to 5% by weight.

EXAMPLE 3

A slurry of the sample No. 10 in Example 1 was prepared. Using a doctor blade, this was cast to form a ceramic green sheet strip having a thickness of 50 μm. After having been dried, this strip was blanked to give ceramic green sheets having a predetermined size. Next, a Cu paste was screen-printed on these ceramic green sheets to form a surface circuit pattern, a capacitor pattern and a coil pattern thereon. Using a puncher, via holes were formed through the sheets, and then filled with Cu paste.

Next, a plurality of the thus-processed green sheets were stacked and pressed to give a laminate, which was then baked in a nitrogen atmosphere at 990° C. to obtain the monolithic ceramic substrate 1 shown in FIG. 1. In FIG. 1, 2 is a dielectric or insulating ceramic layer, 3 is a capacitor device, and 4 is a coil device, and those devices 3 and 4 were formed inside the monolithic ceramic substrate 1.

Next, Si chips 6 were mounted on the surface of the substrate 1 with conductor bumps 5 therebetween.

In the Si chip-mounted, monolithic ceramic substrate produced herein, the thermal expansion coefficient of the substrate was small and was near to that of the Si chips. Therefore, the absence of a substantial difference in the thermal expansion coefficient between the substrate and the chips prevented the substrate from being cracked. In addition, since the dielectric constant of the substrate was small, the signal transmission speed through the substrate was high and the crosstalk noise between the conductor patterns was reduced. Moreover, since the temperature coefficient of electrostatic capacity of the ceramic layers was small, the temperature-dependent stability of the capacitor devices in the substrate was high.

In Examples mentioned hereinabove, used were oxides and carbonates as the powdery raw materials for glass. Apart from these, hydroxides and others are also employable.

Li was used as the alkali metal R. Apart from this, any other alkali metal, such as Na, K, Rb, Cs or Fr, is also employable to produce the same results.

As has been clarified hereinabove, low-temperature sinterable ceramic compositions for monolithic ceramic substrates are obtained according to the present invention, which can be sintered even at low temperatures not higher than 1000° C. to give sound substrates having a small thermal expansion coefficient and a small dielectric constant. The temperature-dependent variation in the electrostatic capacity of the sintered substrates is small.

Using the low-temperature sinterable ceramic compositions of the invention, obtained are monolithic ceramic substrates having better properties than alumina substrates.

Specifically, since the thermal expansion coefficient of the substrates of the invention is small, the difference in the thermal expansion coefficient between the substrates and silicon chips to be mounted thereon is negligible and the substrates with the chips thereon are prevented from being cracked. Therefore, the substrates have high reliability without being deteriorated by moisture. In addition, since the substrates have a low dielectric constant, the signal transmission speed through them is high. Moreover, since the substrates can be sintered at low temperatures not higher than 1000° C., electroconductive materials having a low melting point and having a low resistance value, such as Cu and Ag/Pd, can be used, and the resistance of the electroconductive circuits formed in them is lowered. Further, since the temperature-dependent variation in the electrostatic capacity of the substrates is small, the substrates are most favorable for LCR integration applicable to high frequency driving systems.

While the invention has been described in detail and with reference to specific embodiments thereof, it will be apparent to one skilled in the art that various changes and modifications can be made therein without departing from the spirit and scope thereof.

What is claimed is:

1. A low-temperature sinterable ceramic composition comprising 100 parts by weight of an essential component comprising from about 60 to 85% by weight of cordierite and from about 15 to 40% by weight of glass, and about 15–25 parts by weight of $TiO_2$.

2. The low-temperature sinterable ceramic composition as claimed in claim 1, wherein said glass is composed of:

from about 20 to 60% by weight of $SiO_2$, from about 30 to 50% by weight of $B_2O_3$, from about 5 to 30% by weight of MgO, from 0 to about 15% by weight of $Al_2O_3$, and from about 1 to 5% by weight of $R_2O$ in which R is an alkali metal.

3. The low-temperature sinterable ceramic composition as claimed in claim 2, wherein said essential component comprises from about 65 to 80% by weight of cordierite and from about 20 to 35% by weight of glass, and R is Li.

4. The low-temperature sinterable ceramic composition as claimed in claim 1, wherein said essential component comprises from about 65 to 80% by weight of cordierite and from about 20 to 35% by weight of glass.

5. A laminate comprising a plurality of layers of the composition of claim 2.

6. The laminate of claim 5 having at least one conductor disposed therein.

7. A laminate comprising a plurality of layers of the composition of claim 1.

8. The laminate of claim 7 having at least one conductor disposed therein.

9. A low-temperature sintered ceramic composition comprising 100 parts by weight of an essential component comprising from about 60 to 85% by weight of cordierite and from about 15 to 40% by weight of glass, and about 15–25 parts by weight of $TiO_2$.

10. The low-temperature sintered ceramic composition as claimed in claim 9, wherein said glass is composed of:

from about 20 to 60% by weight of $SiO_2$, from about 30 to 50% by weight of $B_2O_3$, from about 5 to 30% by weight of MgO, from 0 to about 15% by weight of $Al_2O_3$, and from about 1 to 5% by weight of $R_2O$ in which R is an alkali metal.

11. The low-temperature sintered ceramic composition as claimed in claim 10, wherein said essential component comprises from about 65 to 80% by weight of cordierite and from about 20 to 35% by weight of glass, and R is Li.

12. The low-temperature sintered ceramic composition as claimed in claim 9, wherein said essential component comprises from about 65 to 80% by weight of cordierite and from about 20 to 35% by weight of glass.

13. A laminate comprising a plurality of layers of the composition of claim 12.

14. The laminate of claim 13 having at least one conductor disposed therein.

15. A laminate comprising a plurality of layers of the composition of claim 11.

16. The laminate of claim 15 having at least one conductor disposed therein.

17. A laminate comprising a plurality of layers of the composition of claim 10.

18. The laminate of claim 17 having at least one conductor disposed therein.

19. A laminate comprising a plurality of layers of the composition of claim 9.

20. The laminate of claim 19 having at least one conductor disposed therein.

* * * * *